United States Patent [19]

Dijkmans

[11] Patent Number: 4,670,720

[45] Date of Patent: Jun. 2, 1987

[54] SWITCHING DEVICE FOR SUPPRESSING A SIGNAL

[75] Inventor: Eise C. Dijkmans, Eindhoven, Netherlands

[73] Assignee: U.S. Philips Corporation, New York, N.Y.

[21] Appl. No.: 799,877

[22] Filed: Nov. 20, 1985

[30] Foreign Application Priority Data

Dec. 17, 1984 [NL] Netherlands ............. 8403819

[51] Int. Cl.[4] .............................................. H03F 1/26
[52] U.S. Cl. ..................................... 330/255; 330/51; 455/312
[58] Field of Search ................. 330/51, 69, 254, 255, 330/261; 455/194, 212, 218, 298, 311, 312

[56] References Cited

FOREIGN PATENT DOCUMENTS 46508 3/1982 Japan ................................ 330/51

Primary Examiner—James B. Mullins
Attorney, Agent, or Firm—Thomas A. Briody; William J. Streeter; Marianne R. Rich

[57] ABSTRACT

A switching device is provided for suppressing a signal. A signal source is connected to a first differential amplifier. The first differential amplifier receives an operating current from a current source. A second differential amplifier receives an operating current from a current source, and has an input connected to a common signal terminal. A conversion circuit connects the first differential amplifier and second differential amplifier outputs. An output amplifier is connected to the conversion circuit output for amplifying a single ended output of the conversion circuit. A signal from the output amplifier is suppressed by switching the operating current of said first differential amplifier and said output amplifier off, while simultaneously switching the operating current of the second differential amplifier on.

8 Claims, 5 Drawing Figures

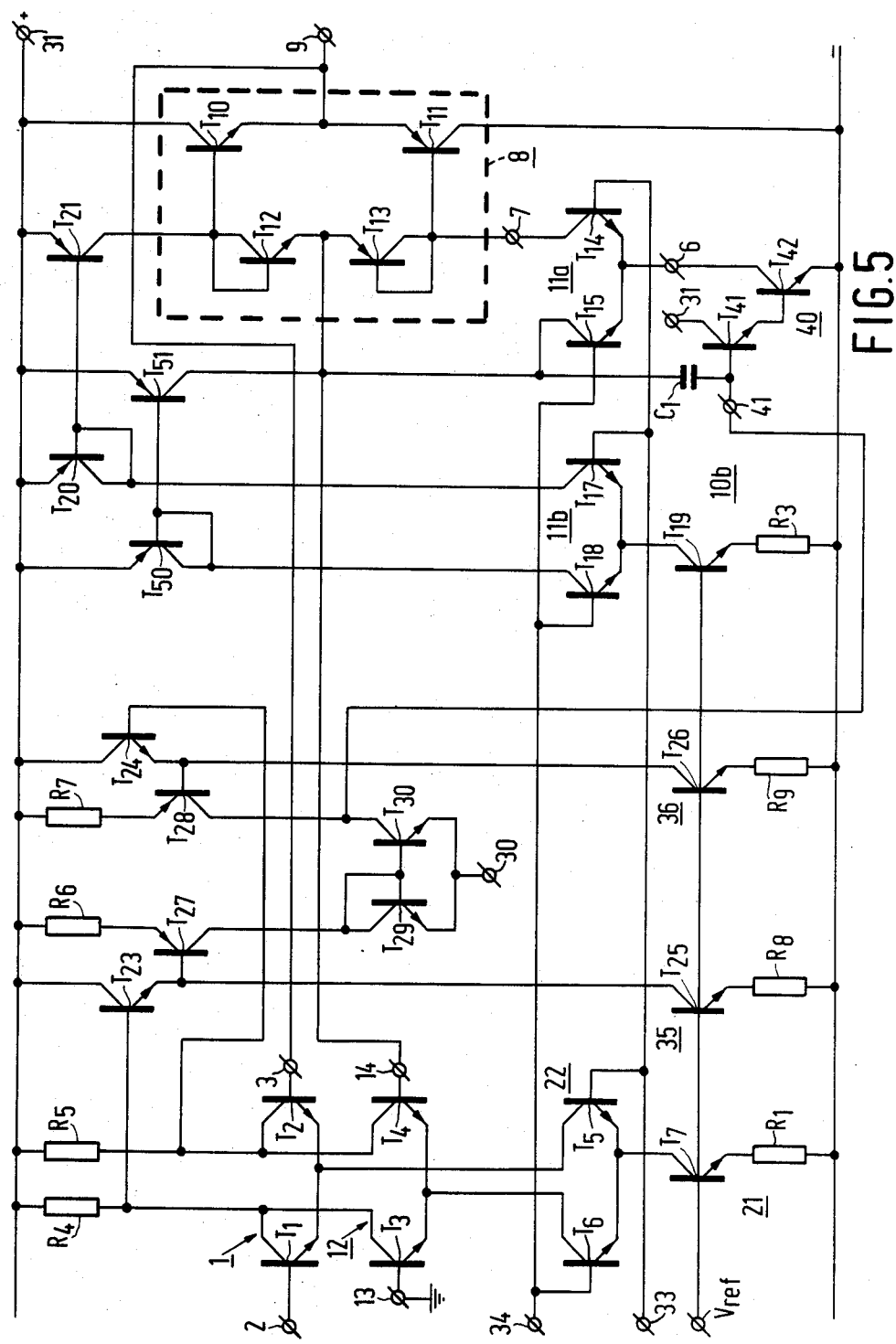

SWITCHING DEVICE FOR SUPPRESSING A SIGNAL

The invention relates to a switching device for suppressing a signal, comprising:

a first differential amplifier which is powered by a disconnectable first current source and which has a first input for the signal to be suppressed, a second input, a first output, and a second output, a first conversion circuit, coupled to the first output and the second output of said differential amplifier, for converting the differential output current of the differential amplifier into a single-ended output current which is applied to an output, and an output amplifier having an input which is coupled to the output of the conversion circuit, which output amplifier comprises two complementary emitter-follower output transistors whose emitters are coupled to an output of the switching device, and a bias circuit comprising two semiconductor junctions which are in series between the bases of the output transistors and which are driven into conduction by means of a disconnectable second current source.

When the power supply is switched on and switched off this gives rise to irregular voltage transients on the output of a circuit, which transients are caused by varying direct-voltage and direct-current settings. Such voltage transients occur at the output of a compact-disc player, which output is constituted by the output of an active low-pass filter. If the player is connected to an amplifier which drives a loudspeaker system, these voltage transients are reproduced as popping sounds which may even damage the loudspeakers. In order to preclude the occurrence of these voltage transients on the output of a circuit, use is made of switching devices (muting circuits), which suppress the signal to the output of the circuit when the power supply is switched on and off. In addition, such switching devices may also be driven by actuation of a switch while the power supply is switched on, so that the signal to the output is also suppressed.

Such a switching device is disclosed in U.S. Pat. No. 4,315,221. The device described therein is constituted by a differential amplifier which is arranged as a voltage follower and whose output drives an output stage comprising two complementary output transistors arranged as emitter followers. These output transistors are operated in class AB by means of a bias circuit comprising two diodes and two current sources included in a switchable current mirror. The signal to the output of the output stage is suppressed by switching off the current mirror and hence the quiescent current of the output stage. However, a drawback of this circuit is that in the switched-off condition the input signal is present on the input of the output stage, so that the signal may still appear on the output of the output stage as a result of crosstalk. Another drawback is that in the switched-on condition on the output signal may be distorted as a result of the non-linear resistance of the output transistors.

U.S. Pat. No. 4,366,442 discloses a switching device of the type defined in the opening paragraph, which also comprises a differential amplifier whose output drives a class AB output stage by means of two diodes and a current source. However, the output stage in this switching device comprises two parallel branches each comprising two complementary output transistors. The output of the first branch is fed back to an input of the differential amplifier and the output of the second branch constitutes the output of the switching device. The signal to this output is suppressed by switching off the current sources of the differential amplifier and the output stage. This arrangement also has the drawback that the output signal may be distorted in the switched-on condition. The output transistors of the first branch produce hardly any distortion owing to the feedback, but unless they are loaded in the same way as the output transistors of the first branch the output transistors of the second branch will give rise to distortion. However, in general these transistors are not loaded in the same way.

Therefore, it is the object of the invention to provide a switching device which in the switched-on condition produces less distortion of the output signal and the switched off condition suppresses the signal to the output to a large extent, in such a way that crosstalk of the signal to the output is substantially impossible.

SUMMARY OF THE INVENTION

In accordance with the invention a switching device of the type specified in the opening paragraph is characterized in that the circuit further comprises:

a second differential amplifier which is powered by a disconnectable third current source and which has a first input which is earthed for signals, a second input, a first output, and a second output, and a second conversion circuit, coupled to the first output and the second output of the second differential amplifier, for converting the differential output current of the second differential amplifier into a single ended output current which is applied to an output connected to the second input of the second differential amplifier and to the input of the output amplifier, and in that the output of the output amplifier is connected to the second input of the first differential amplifier, and for suppressing the signal to the output of the switching device, the first current source and the second current source are switched off and the third current source is switched on.

The invention is based on the recognition of the following facts. In the switched-on condition the output of the output stage is fully fed back to the second input of the first differential amplifier, so that the switching device operates as a voltage follower. This negative feedback leads to a substantial reduction of the distortion produced by the non-linear resistance of the output transistors, so that the input signal appears substantially undistorted on the output. In the switched-off condition the first differential amplifier and the output amplifier are currentless, whilst a second differential amplifier is switched on. The first input of the latter is connected to earth and its output is fully fed back to the second input, so that this differential amplifier operates as a voltage follower. Then there is no signal on the input of the output amplifier in the switched-off condition, so that the input signal is suppressed almost completely and the occurrence cross-talk is precluded.

An advantageous embodiment of the invention is characterized in that the first current source and the third current source are replaced by a current source which is common to the first differential amplifier and the second differential amplifier and which is switchable from the first differential amplifier to the second differential amplifier and vice versa, and the first conversion circuit and the second conversion circuit are replaced by a conversion circuit which is common to the first differential amplifier and the second differential amplifier. A further embodiment may be characterized in that the output of the conversion circuit is connected to the input of a driver amplifier having an output coupled to the input of the output amplifier.

Embodiments of the invention will now be described in more detail, by way of example, with reference to the accompanying drawings

DESCRIPTION OF THE FIGURES

FIG. 5 shows a switching device in accordance with a third embodiment of the invention.

DESCRIPTION OF THE PREFERRED EMBODIMENT

Figure 1:
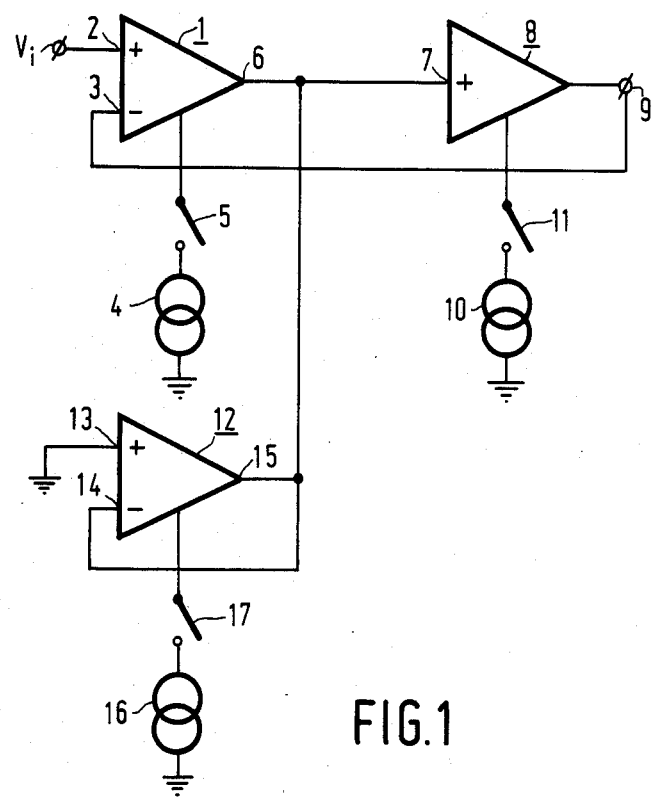
FIG. 1 represents the basic diagram of a switching device in accordance with the invention.

FIG. 1 is the basic diagram of a switching device in accordance with the invention. The switching device comprises a first input amplifier 1 having a non-inverting input 2, to which an input signal $v_i$ may be applied, and an inverting input 3. The input amplifier 1 comprises a differential amplifier, not shown for the sake of clarity, whose bias current is furnished by a current source 4 which can be disconnected by means of a switch 5. The output 6 of the amplifier 1 is connected to the input 7 of an output amplifier 8. The output 9 of this amplifier 8 constitutes the output of the switching device and is connected to the inverting input 3 of the input amplifier 1. The output amplifier 8 receives a bias current which is supplied by at least one current source 10, which can be disconnected by means of a switch 11. Further, the switching device comprises a second input amplifier 12 having a non-inverting input 13 which is earthed for signals, and an inverting input 14. The output 15 of this amplifier 12 is connected to the inverting input 14 and to the input 7 of the output amplifier 8. The second input amplifier 12 also comprises a differential amplifier, not shown, whose bias current is furnished by a current source 16 which can be switched on by means of a switch 17. The switches 5, 11 and 17 are energised by control means, not shown, in such a way that the switches 5 and 11 are closed simultaneously and at the same time the switch 17 is opened, and vice versa.

The switching device operates as follows. In the switched-on condition of the switching device the switches 5 and 11 are closed and the switch 17 is consequently open. The first input amplifier 1 and the output amplifier 8 are powered by the current sources 4 and 10. Owing to full negative feedback from the output 9 of the output amplifier 8 to the inverting input 3 of the first input amplifier 1 the switching device operates as a voltage follower. The distortion, which is mainly caused by the output amplifier 8 is reduced substantially by this negative feedback, so that the substantially undistorted input voltage $v_i$ appears on the output 9. In the switched-off condition of the switching device the switches 5 and 11 are open and the switch 17 is closed, so that now only the second input amplifier 12 is operative. Owing to the full negative feedback from the output 15 to the inverting input 14, this input amplifier 12 operates as a voltage follower. The voltage on the output 15 and hence on the input 7 of the output amplifier is therefore O V. As in the switched-off condition no signal appears on the input 7 of the output amplifier 8, the signal cannot appear on the output 9 as a result of crosstalk.

Figure 2:
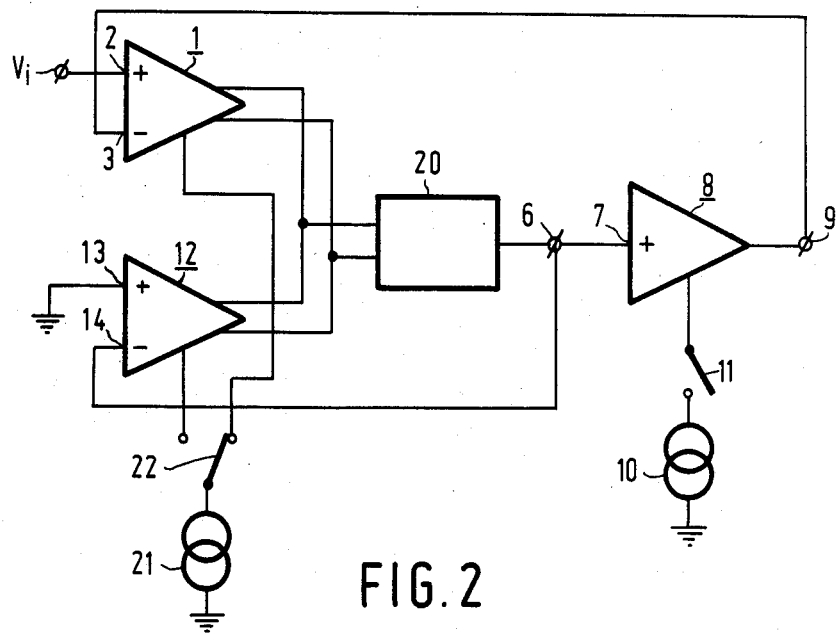
FIG. 2 shows the diagram of FIG. 1 in simplified form.

The first differential amplifier 1 and the second differential amplifier 12 have equal loads, which may be followed by identical driver amplifiers. The basic arrangement shown in FIG. 1 may be simplified by combining the two loads into one common load and the driver amplifiers into one common driver amplifier. FIG. 2 shows this simplified arrangement, in which the common load and, as the case may be, the common driver amplifier bear the reference numeral 20. Further, the current sources 4 and 16 may be combined to form one current source 21 which can be switched from differential amplifier 1 to differential amplifier 12 and vice versa by means of one switch 22. Otherwise the circuit operates in the same way as that shown in FIG. 1.

Figure 3:
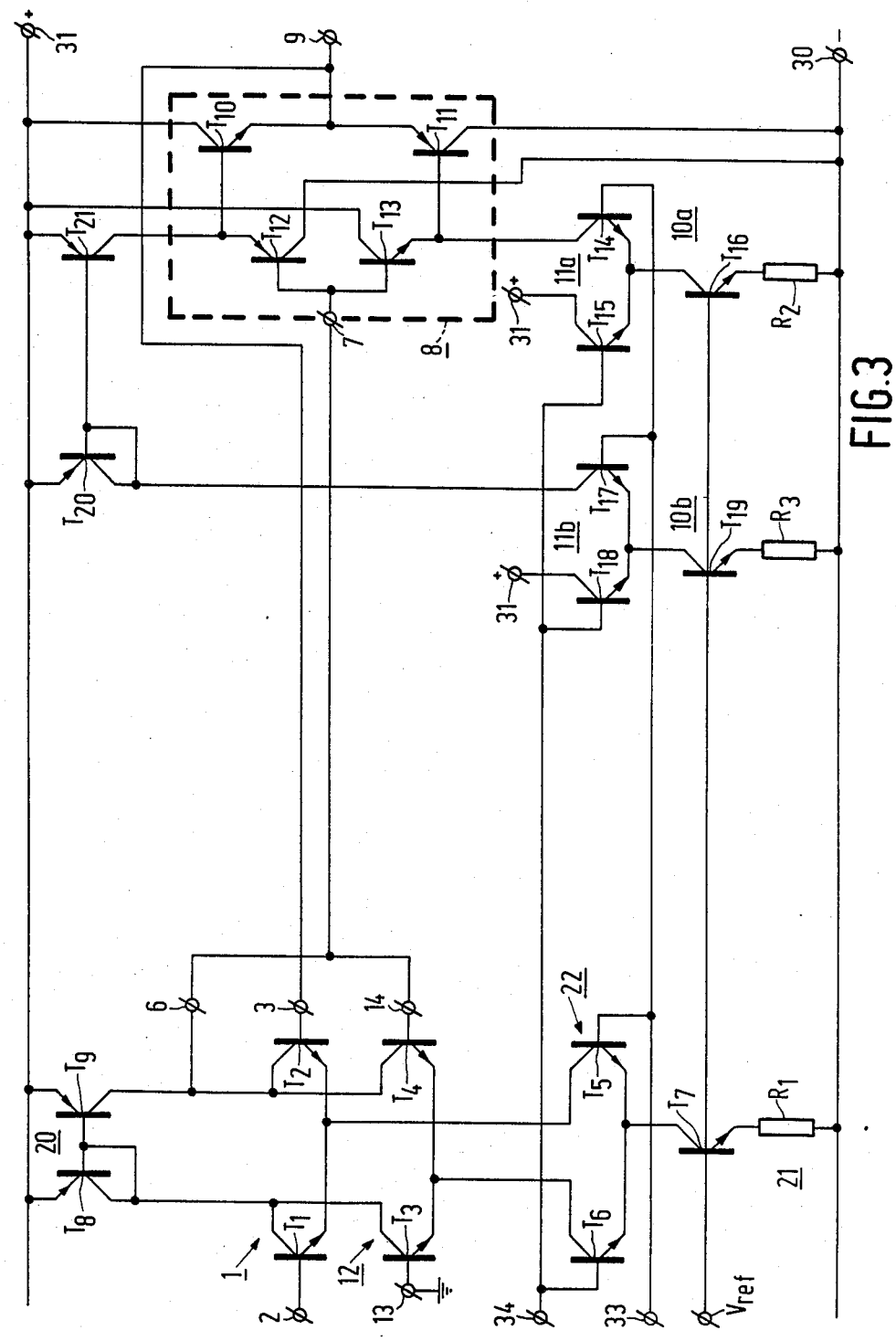
FIG. 3 shows a switching device in accordance with a first embodiment of the invention.

A switching device in accordance with a first embodiment based on the diagram of FIG. 2 will be described in more detail with reference to FIG. 3. Identical parts bear the same reference numerals as in FIG. 2. The first differential amplifier 1 comprises two transistors $T_1$ and $T_2$, the base 2 of the transistor $T_1$ constituting the non-inverting input to which an input signal $v_i$ is applied, and the base 3 of transistor $T_2$ constituting the inverting input. The collector of transistor $T_1$ is connected to an input of a current mirror 20, which comprises a diode-connected transistor $T_8$ and a transistor $T_9$ and which has its output connected to the collector of transistor $T_2$ and to the output 6 of the differential amplifier. The current mirror 20 constitutes a conversion circuit by means of which the differential collector currents of the transistors $T_1$ and $T_2$ are converted into a single-ended output current. The second differential amplifier 12 comprises two transistors $T_3$ and $T_4$, the base 13 of the transistor $T_3$ being connected to earth and constituting the non-inverting input. The collector of transistor $T_3$ and the collector of transistor $T_4$ are connected to the collector of transistor $T_1$ and the collector of transistor $T_2$, respectively, so that the current mirror 20 constitutes a conversion circuit which is common to the two differential amplifiers 1 and 12. The base 14 of transistor $T_4$ constitutes the inverting input of the differential amplifier 12 and is connected to the output 6 of this amplifier. The emitter currents of the diferential amplifiers 1 and 12 are furnished by a current source 21 which comprises a transistor $T_7$ whose base is at a reference voltage $V_{ref}$ and whose emitter is connected to the negative power-supply line 30 by means of a resistor $R_1$. The current from the current source 21 can be switched from one differential amplifier to the other by means of a switch 22 comprising two transistors $T_5$ and $T_6$ arranged as a differential pair, the control signals for this change-over being applied to the base 33 of the transistor $T_5$ and the base 34 of the transistor $T_6$, respectively.

The common output 6 of the two differential amplifiers 1 and 12 is connected to the input 7 of an output amplifier 8 comprising two complementary output transistors $T_{10}$ and $T_{11}$ arranged as an emitter followers, the common emitter terminal constituting the output 9 of the switching device. The base of the transistor $T_{11}$ is connected to the emitter of a transistor $T_{13}$, whose base is connected to the base of a transistor $T_{12}$, whose base is connected to the input 7 of the output amplifier 8. The collector of $T_{13}$ is connected to the positive power-supply terminal 31. The emitter of the transistor $T_{13}$ can be connected to a current source 10a by means of a switch 11a, which current source comprises a transistor $T_{16}$ whose base is at a reference voltage and whose emitter is connected to the negative power-supply terminal 30 by a resistor $R_2$. The switch 11a comprises two transistors $T_{14}$ and $T_{15}$ arranged as a differential pair, the collector of the transistor $T_{14}$ being connected to the emitter of the transistor $T_{13}$ and the collector of the transistor $T_{15}$ being connected to the positive power-supply terminal 31. The control signals applied to the bases of the transistors $T_{14}$ and $T_{15}$ are the same as those applied to the bases 33 and 34 of the transistors $T_5$ and $T_6$. The base of transistor $T_{10}$ is connected to the emitter of a transistor $T_{12}$, whose base is connected to the input 7 and whose collector is connected to the negative power-supply terminal 30. The emitter of the transistor $T_{12}$ is connected to the output of a current mirror comprising a diode-connected transistor $T_{20}$ and transistor $T_{21}$, whose base-emitter junction is arranged in parallel with that of the transistor $T_{20}$. The input of the current mirror may be connected to a current source 10b by means of a switch 11b, which current source comprises a transistor $T_{19}$ whose base is at a reference voltage and whose emitter is connected to the negative power-supply terminal 30 through a resistor $R_3$. The switch 11b comprises two transistors $T_{17}$ and $T_{18}$ arranged as a differential pair, the collector of the transistor $T_{17}$ being connected to the input of the current mirror $T_{20}$, $T_{21}$ and the collector of the transistor $T_{18}$ being connected to the positive power-supply terminal 31. The base of the transistor $T_{17}$ is connected to the base 33 of the transistor $T_5$ and the base of the transistor $T_{18}$ is connected to the base 34 of the transistor $T_6$.

In the switched-on condition of the switching device the terminals 33 and 34 receive such control signals that the voltage on the base of the transistor $T_5$ is high relative to the voltage on the base of the transistor $T_6$. As a result of this, the transistor $T_5$ is turned on and the transistor $T_6$ is turned off. Thus, the current source 21 is connected to the differential amplifier 1 and the differential amplifier 12 is disconnected. Similarly, the transistor $T_{14}$ conducts the transistor $T_{15}$ is cut off, so that the current source 10a is connected to the emitter of the transistor $T_{13}$. In the same way, the current source 10b is connected to the emitter of the transistor $T_{12}$ via the conductive transistor $T_{17}$ and the current mirror $T_{20}$, $T_{21}$. The conducting transistors $T_{12}$ and $T_{13}$ ensure that a voltage equal to two base-emitter voltages appears between the bases of the transistors $T_{10}$ and $T_{11}$. As a result of this voltage a small quiescent current will flow in the output transistors $T_{10}$ and $T_{11}$, so that the output amplifier 8 is operated in class AB.

Since there is full negative feedback from the output of the output amplifier 8 to the inverting input 3 of the differential amplifier 1, the combination of the differential amplifier and the output amplifier 8 will behave as a voltage follower in the switched-on condition. Therefore, the voltage on the output 9 is substantially equal to the voltage on the input 2 and the harmonic distortion of the output signal as a result of the non-linearity of the resistances of the output transistors $T_{10}$ and $T_{11}$ is reduced substantially by the negative feedback.

In the switched-off condition on the voltage on the base 34 of the transistor $T_6$ is high relative to the voltage on the base of the transistor $T_5$, so that the transistor $T_6$ is turned on and the transistor $T_5$ is cut off. As a result of this, the current source 21 is connected to the commoned emitters of the transistors $T_3$ and $T_4$ through the transistor $T_6$, so that now the differential amplifier 12 is switched on and the differential amplifier 1 is turned off. The voltages on the bases of the transistors $T_{18}$ and $T_{15}$ are now also high relative to the voltages on the bases of the transistors $T_{17}$ and $T_{14}$, so that the transistors $T_{18}$ and $T_{15}$ conduct and the transistors $T_{14}$ and $T_{17}$ are cut off. In this case the current sources 10a and 10b are connected to the positive power-supply terminal 31, so that the output amplifier 8 is currentless. The output 9 of the output amplifier 8 then has a high impedance. As the output 6 is connected to the inverting input 14, the differential amplifier 12 will behave as a voltage follower. The voltage on the output 6 and hence on the input 7 of the output amplifier 8 is then 0 V. Therefore, no signal will appear on the input 7 of the output amplifier 8 in the switched-off condition, so that a very good suppression of the input signal is obtained.

It is to be noted that in the present embodiment the transistors of the differential amplifiers 1 and 2, the switch 22 and the current source 21 may alternatively be PNP transistors, in which case the transistors of the current mirror 20 should be NPN transistors. The input of the current mirror should then be connected to the collector the transistor $T_2$ and the output of the current mirror should be connected to the collector of the transistor $T_1$. Further other current mirror may be used instead of the current mirror shown. Moreover, the collectors of the transistors $T_{12}$ and $T_{13}$ may be connected to the base of the relevant transistor instead of to the negative power-supply terminal and the positive power-supply terminal, so that the transistors $T_{12}$ and $T_{13}$ are then connected as diodes.

Figure 4:
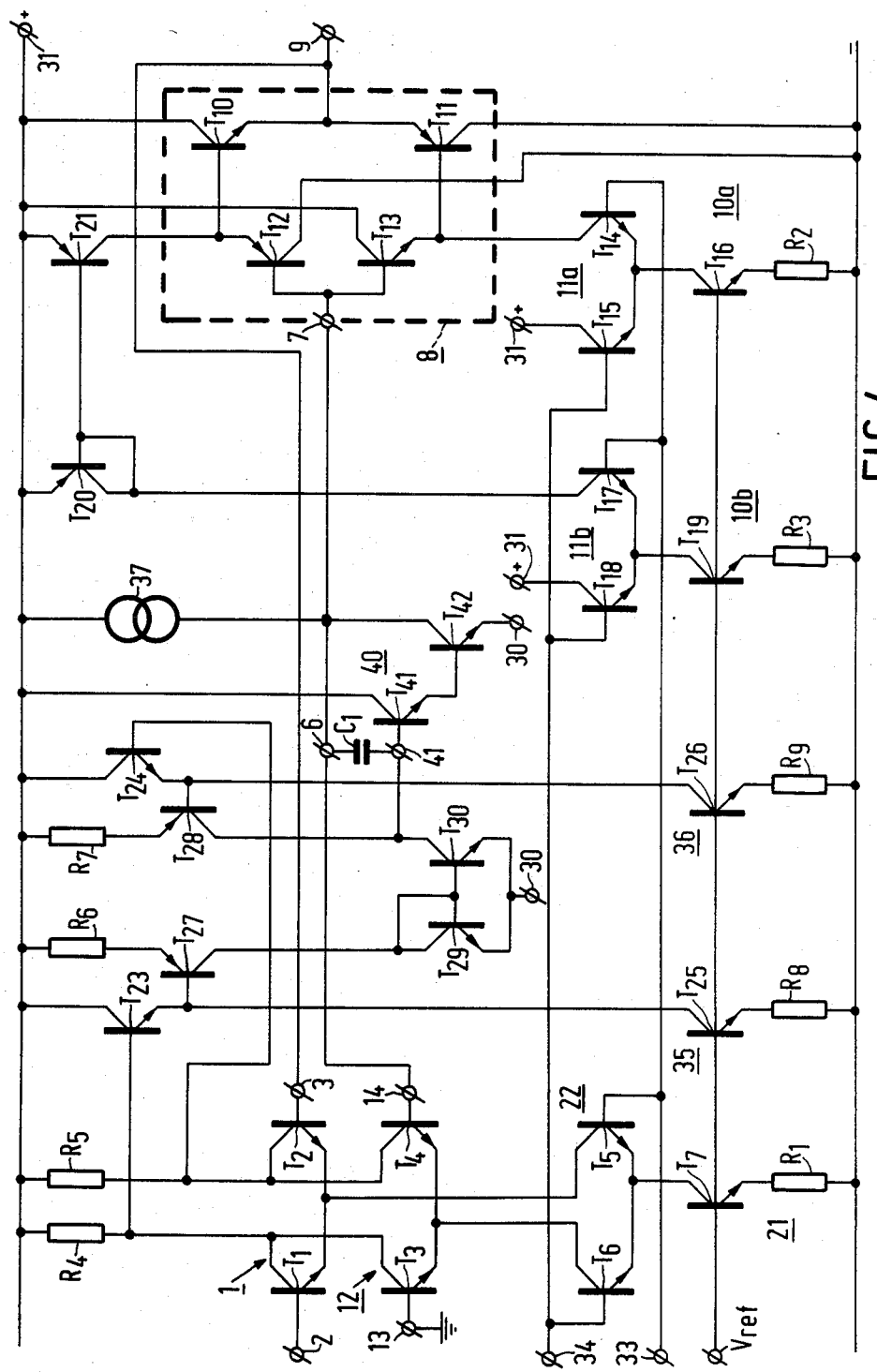
FIG. 4 shows a switching device in accordance with a second embodiment of the invention.

A switching device in accordance with a second embodiment will now be described in more detail with reference to FIG. 4, in which identical parts bear the same reference numerals as in FIG. 3. Now the interconnected collectors of the transistors $T_1$ and $T_3$ and the interconnected collectors of the transistors $T_2$ and $T_4$ are not connected to the input and to the output of a current mirror, respectively, but are connected to the positive power-supply terminal 31 by means of a resistor $R_4$ and an identical resistor $R_5$, respectively. The voltages across the resistors $R_4$ and $R_5$ are applied to the base of a transistor $T_{23}$, which is operated as an emitter follower by means of a current source 35, and to the base of a transistor $T_{24}$, which is operated as an emitter follower by means of a current source 36, respectively.

The current sources 35 and 36 comprise transistors $T_{25}$ and $T_{26}$ whose bases are at a reference voltage and whose emitters are connected to the negative power-supply terminal 30 by a resistor $R_8$ and a resistor $R_9$, respectively. The emitter of the transistor $T_{23}$ is connected to the base of a transistor $T_{27}$, whose emitter is connected to the positive power-supply terminal 31 by a resistor $R_6$. Similarly, the emitter of the transistor $T_{24}$ is connected to the base of a transistor $T_{28}$ having a resistor $R_7$ arranged in the emitter line. The collector of the transistor $T_{27}$ is connected to the collector of the transistor $T_{28}$ by a current mirror comprising a diode-connected transistor $T_{29}$ and a transistor $T_{30}$ whose base-emitter junction is arranged in parallel with that of the transistor $T_{29}$. The transistors $T_{23}$ to $T_{30}$ with the resistors $R_4$ to $R_7$ constitute a conversion circuit for converting the collector currents of the transtors $T_1$ and $T_2$ into a single-ended output current. The collector current of the transistor $T_1$ is converted into a voltage by means of resistor $R_4$, which voltage is applied to the voltage-to-current converter. $T_{27}$, $R_6$ via the emitter follower $T_{23}$ and the current source 35. The collector current of the transistor $T_{27}$ is consequently inverted relative to the collector current of the transistor $T_1$. Similarly, the collector current of the transistor $T_{28}$ is inverted relative to the collector current or the transistor $T_2$. As a result of this, the output current of the current mirror $T_{29}$, $T_{30}$ is inverted relative to the output current of the current mirror 20 in the embodiment shown in FIG. 3, which is necessary in view of the inverting driver amplifier used in the circuit shown in FIG. 4. The collector of the transistor $T_{28}$ is connected to the input 41 of this driver amplifier 40, which comprises two transistors $T_{41}$ and $T_{42}$ in Darlington arrangement, the collector of the transistor $T_{41}$ being connected to the positive power-supply terminal 31 and the collector of the transistor $T_{42}$ being connected to a current source 37. The collector of the transistor $T_{42}$ constitutes the common output 6 of the first input amplifier and the second input amplifier. For the purpose of frequency compensation a capacitor $C_1$ is arranged between the output 6 and the input 41 of the driver amplifier 40. The output 6 is connected to the inverting input 14 of the second differential amplifier 12 and to the input 7 of the output amplifier 8, which is of the same construction as that shown in FIG. 3. The driver amplifier 40 provides an additional amplification of the signal from the differential amplifiers. The circuit operates in the same way as that in FIG. 3. In the switched-on condition the differential amplifier 1 together with the driver amplifier 40 and the output amplifier 8 are driven and the negative feedback between the output 9 and the inverting input 3 ensures that the voltage on the output 9 is substantially identical to the voltage on input 2. In the switched-off condition the second differential amplifier 12 together with the driver amplifier 40 is driven. The negative feedback from the output 6 to the inverting input 14 ensures that the voltage on the output 6 is again 0 V, so that again no signal will appear on the input 7 of the output amplifier 8 in the switched-off condition. In this embodiment the first differential amplifier 1 and the second differential amplifier 12 may comprise PNP transistors, in which case the collectors of the transistors $T_1$ and $T_2$ should be connected to the input and the output, respectively, of a current mirror, the input of which the driver amplifier being driven directly by the output.

A switching device in accordance with a third embodiment will be described with reference to FIG. 5, in which identical parts bear the same reference numerals as in FIG. 4. Up to the common driver amplifier the circuit is identical to that shown in FIG. 4. The output amplifier 8 differs from that shown in FIG. 4 in that the transistor $T_{12}$ is an NPN-transistor instead of a PNP-transistor and the transistor $T_{13}$ is a PNP-transistor instead of an NPN-transistor. The transistors $T_{12}$ and $T_{13}$ are now arranged between the bases of the output transistors $T_{10}$ and $T_{11}$ and are connected as diodes, the emitters of these transistors being interconnected and being connected to the input 14 of the second differential amplifier 12 and to the collectors of the transistors $T_{15}$ and $T_{51}$. The collector of the transistor $T_{13}$ constitutes the input 7 of the output amplifier 8 and is again connected to the collector of the transistor $T_{14}$ which together with transistor $T_{15}$ constitutes the switch 11a. In the present embodiment the common emitter terminal of the transistors $T_{14}$ and $T_{15}$ is not connected to a current source but to the output 6 of the driver amplifier 40, which is otherwise identical to the driver amplifier 40 in FIG. 4, except for the capacitor $C_1$ which is now arranged between the input 41 of the driver amplifier 40 and the junction point of the emitters of the transistors $T_{12}$ and $T_{13}$. In the same way as in FIG. 4 the collector of the transistor $T_{12}$ is connected to the collector of the transistor $T_{17}$ through a current mirror comprising transistors $T_{20}$ and $T_{21}$, which transistor $T_{17}$ together with the transistor $T_{18}$ constitutes a differential pair whose common emitter terminal is connected to a current source 10b, which comprises the transistor $T_{19}$ and the resistor $R_3$. Now the collector of the transistor $T_{18}$ is not connected to the positive power-supply terminal 31 but to the collector of the transistor $T_{15}$ through a current mirror comprising the transistors $T_{50}$ and $T_{51}$.

In the switched-on condition that voltage on the bases of the transistor $T_{14}$ and the transistor $T_{17}$ is high relative to the voltage on the bases of the transistor $T_{15}$ and the transistor $T_{18}$, so that the transistors $T_{14}$ and $T_{17}$ conduct and the transistors $T_{15}$ and $T_{18}$ are cut off. The current from the current source 10b now flows through the diodes $T_{12}$, $T_{13}$ through the transistor $T_{17}$ and the current mirror $T_{20}$, $T_{21}$. The current now flowing in these diodes $T_{12}$, $T_{13}$ is of the order of magnitude of 1 mA. If the input 41 of the driver amplifier 40 is driven as far as possible towards the level of the negative power-supply terminal, the transistor $T_{42}$ will be substantially cut off and the collector current of the transistor $T_{21}$ will flow almost entirely to the base of the transistor $T_{10}$. The last-mentioned transistor is a NPN transistor whose current gain factor $\beta \approx 100$, so that the maximum output current in the present case is of the order of magnitude of 100 mA. If the input 41 of the driver amplifier is driven as far as possible towards the level of the positive power-supply terminal 31, the transistor $T_{42}$ will be fully conductive. The maximum collector current of the transistor $T_{42}$ is equal to the product of the current gain factors of the NPN transistors $T_{41}$ and $T_{42}$ and the maximum output current of the input amplifiers 1 and 2. The current gain factors are $\beta \approx 100$ and the maximum output current is dictated by the output current of the current source 21, which may be of the order of magnitude of 10 $\mu$A. Consequently, the maximum collector current of the transistor $T_{42}$ is of the order of magnitude of 100 mA. Of this current 1 mA is furnished by the transistor $T_{21}$. The remainder (99 mA) is obtained via the base of the transistor $T_{11}$. For large currents the current gain factor of this PNP-transistor $T_{11}$ is $\beta \approx 0.5$, so that the maximum output current ($\approx \beta + 1$) is of the order of magnitude of 100 mA. The maximum output currents of the NPN transistor $T_{10}$ and the PNP transistor $T_{11}$ are better in conformity with each other in this circuit, which has a favourable effect on the distortion introduced by the output transistors. In the switched-off condition the voltages on the bases of the transistor $T_{18}$ and the transistor $T_{15}$ are high relative to the voltages on the bases of the transistors $T_{17}$ and $T_{14}$, so that the transistors $T_{18}$ and $T_{15}$ conduct and the transistors $T_{17}$ and $T_{14}$ are cut off. The current from the current source 10b now flows to the output 6 of the driver amplifier 40 through the current mirror $T_{50}$, $T_{51}$ and the transistor $T_{15}$, which driver amplifier takes up this entire current. As the transistors $T_{21}$ and $T_{14}$ do not conduct, the output amplifier 8 is turned off and no signal will appear on its input 7.

The invention is not limited to the present embodiments, because many modifications are possible within the scope of the invention as defined by the Claims. For example, other types of switches may be used for the switches 22, 11a and 11b shown in the Figures Moreover, the differential amplifiers 1 and 12 may be of different types. The same applies to the driver amplifiers 40. In the embodiments shown the switching device is connected to a symmetrical power supply. In order to ensure that the first input of the first differential amplifier, to which the input signal is applied, and the first input of the second differential amplifier, which is connected to earth for input signals, are at a direct voltage of zero volts, these inputs may be connected to, for example, a tap of a voltage divider comprising two identical resistors and arranged between the positive power-supply terminal and the negative power-supply terminal. However, the switching device may also be operated with an asymmetrical power supply. The first inputs of the two differential amplifiers and the output of the switching device may then be connected by a resistor, in known manner, to a tap on a series arrangement of a resistor and a capacitor arranged between the positive power-supply terminal and the negative power-supply terminal. The delay in coupling the output to the remainder of the circuit when the power supply is switched on should then be adapted to the time required for charging this capacitor.

What is claimed is:

1. A switching device for suppressing a signal comprising:
   a signal source comprising a signal terminal and common terminal;
   a first differential amplifier having means for recieving an operating current from a current source, said differential amplifier having a first input for receiving from said signal terminal a signal to be suppressed, a second input for receiving a feedback signal, and having a first output and second output;
   a second differential amplifier having means for receiving an operating current from a current source, and having a first input connected to said common terminal, a second input, and first and second outputs;
   a conversion circuit connected to said first differential amplifier first and second outputs, and to said second differential amplifier first and second outputs for converting differential output signals from said first and second differential amplifiers to a single ended output;
   an output amplifier having an input connected to said single ended output, and having means for supplying a feedback signal to said first differential amplifier second input, said output amplifier comprising two complementary emitter follower output transistors having emitters coupled to an output terminal, and a bias circuit comprising two semiconductor junctions connected in series between the bases of the output transistors, said output amplifier having means for receiving an operating current from a current source; and
   means for switching said output amplifier operating current and said first differential amplifier operating current off and said second differential amplifier operating current on, whereby a signal from said output amplifier output terminal is suppressed.

2. A switching device for suppressing a signal according to claim 1 further comprising:
   a first current source for supplying said first differential amplifier operating current and said second differential amplifier operating current; and
   said means for switching including means for diverting said first differential amplifier operating current to said second differential amplifier, whereby said second differential amplifier receives an operating current.

3. A switching device as claimed in claim 2, wherein the conversion circuit comprises a current mirror having an input which is coupled to the first output of the first differential amplifier and the second differential amplifier and an output which is coupled to the second output of the first differential amplifier and the second differential amplifier.

4. A switching device as claimed in claim 3, further comprising a current inverting circuit is arranged between the first output of the first differential amplifier, and the second differential amplifier and the input of the current mirror and between the second output of the first differential amplifier and the second differential amplifier and the output of the current mirror.

5. A switching device as claimed in claim 2, wherein first a driver amplifier is provided having an output coupled to the input of the output amplifier, and wherein the output of the conversion circuit is connected to the input of said driver amplifier.

6. A switching device as claimed in claim 5, wherein the output of the driver amplifier is connected to the input of the output amplifier by means of a first switch and to a current source by means of a second switch, the first switch being opened and the second switch being closed to suppress the signal.

7. A switching device according to claim 6 wherein a single current source is switched to supply an operating current to said output amplifier and said driver amplifier output.

8. A switching device according to claim 1 wherein said output amplifier operating current is supplied from two current sources, each of which is connected to one end of the series connections of said two semiconductor junctions.

* * * * *

UNITED STATES PATENT AND TRADEMARK OFFICE
CERTIFICATE OF CORRECTION

PATENT NO. : 4,670,720

DATED : June 2, 1987

INVENTOR(S) : Eise C. Dijkmans

It is certified that error appears in the above-identified patent and that said Letters Patent is hereby corrected as shown below:

Claim 5, line 2    delete "first"

Signed and Sealed this

Sixth Day of February, 1990

Attest:

JEFFREY M. SAMUELS

Attesting Officer     Acting Commissioner of Patents and Trademarks